US010236347B2

United States Patent
Hussain

(10) Patent No.: US 10,236,347 B2
(45) Date of Patent: Mar. 19, 2019

(54) METHOD OF PRODUCING AN ELECTRONIC DEVICE WITH A GRAPHENE DEVICE AND SEMICONDUCTOR DEVICE FORMED ON A COMMON SEMICONDUCTOR SUBSTRATE

(71) Applicant: KING ABDULLAH UNIVERSITY OF SCIENCE AND TECHNOLOGY, Thuwal (SA)

(72) Inventor: Aftab Mustansir Hussain, Thuwal (SA)

(73) Assignee: KING ABDULLAH UNIVERSITY OF SCIENCE AND TECHNOLOGY, Thuwal (SA)

( * ) Notice: Subject to any disclaimer, the term of this patent is extended or adjusted under 35 U.S.C. 154(b) by 0 days.

(21) Appl. No.: 15/664,578

(22) Filed: Jul. 31, 2017

(65) Prior Publication Data
US 2018/0040700 A1 Feb. 8, 2018

Related U.S. Application Data

(60) Provisional application No. 62/372,188, filed on Aug. 8, 2016.

(51) Int. Cl.
*H01L 21/00* (2006.01)
*H01L 29/16* (2006.01)
(Continued)

(52) U.S. Cl.
CPC ...... *H01L 29/1606* (2013.01); *H01L 21/0262* (2013.01); *H01L 21/02381* (2013.01);
(Continued)

(58) Field of Classification Search
CPC . H01L 23/66; H01L 23/525; H01L 23/53276; H01L 27/088; H01L 27/1218; H01L 29/1606; H01L 29/0847; H01L 29/66045; H01L 29/78684; H01L 2223/6677; H01L 21/02381; H01L 21/02527; H01L 21/02447; H01L 21/0262; H01L 21/02639; H01L 21/8258;
(Continued)

(56) References Cited

U.S. PATENT DOCUMENTS 7,947,955 B2 * 5/2011 Kawano .................. H01L 31/09
250/341.1
8,043,687 B2 * 10/2011 Kamins ................... C30B 25/02
117/105

(Continued)

OTHER PUBLICATIONS

Tamagnone et al., "Reconfigurable terahertz plasmonic antenna concept using a graphene stack", 2012, Applied Physics Letters, vol. 101, pp. 21402-1-21402-4 (published Nov. 21, 2012).*

(Continued)

*Primary Examiner* — Nikolay K Yushin
(74) *Attorney, Agent, or Firm* — Patent Portfolio Builders PLLC

(57) ABSTRACT

A method for producing an electronic device involves forming a graphene precursor on a first portion of a common semiconductor substrate, forming a graphene layer on the graphene precursor, and forming a semiconductor device on a second portion of the common semiconductor substrate.

10 Claims, 7 Drawing Sheets

(51) Int. Cl.
*H01L 21/02* (2006.01)
*H01L 29/08* (2006.01)
*H01L 23/66* (2006.01)
*H01L 29/786* (2006.01)
*H01L 29/66* (2006.01)
*H01L 27/088* (2006.01)
*H01L 21/8258* (2006.01)
*H01L 27/00* (2006.01)
*H01L 29/00* (2006.01)
*H01Q 1/36* (2006.01)
*H01Q 1/38* (2006.01)
*H01L 29/778* (2006.01)
*H01L 27/092* (2006.01)

(52) U.S. Cl.
CPC .. *H01L 21/02447* (2013.01); *H01L 21/02527* (2013.01); *H01L 21/02612* (2013.01); *H01L 21/02639* (2013.01); *H01L 21/8258* (2013.01); *H01L 23/66* (2013.01); *H01L 27/088* (2013.01); *H01L 29/0847* (2013.01); *H01L 29/66045* (2013.01); *H01L 29/66742* (2013.01); *H01L 29/78684* (2013.01); *H01L 27/092* (2013.01); *H01L 29/7781* (2013.01); *H01L 2223/6677* (2013.01); *H01Q 1/368* (2013.01); *H01Q 1/38* (2013.01)

(58) Field of Classification Search
CPC ........... H01L 21/02612; H01L 27/1292; H01L 27/115; H01L 29/7781; H01Q 1/368; H01Q 1/38; H01Q 1/2283; H01Q 1/243; H01Q 1/225; H01Q 1/248
See application file for complete search history.

(56) References Cited

U.S. PATENT DOCUMENTS

| | | | | |
|---|---|---|---|---|
| 8,410,474 B2* | 4/2013 | Okai | ...................... | B82Y 40/00 257/29 |
| 8,541,769 B2* | 9/2013 | Chu | .................. | H01L 21/02378 257/14 |
| 8,805,148 B2* | 8/2014 | Avouris | ................... | G02B 6/10 385/122 |
| 8,808,810 B2* | 8/2014 | Veerasamy | ............ | B82Y 30/00 427/508 |
| 9,250,389 B2* | 2/2016 | Avouris | ............... | G02B 6/1226 |
| 9,306,005 B2* | 4/2016 | Byun | ................... | H01L 29/452 |
| 9,618,474 B2* | 4/2017 | van Rooyen | ........ | G01N 27/414 |
| 9,812,604 B2* | 11/2017 | Hsu | ...................... | H01L 31/109 |
| 2010/0200755 A1* | 8/2010 | Kawano | .................. | H01L 31/09 250/338.4 |
| 2011/0143045 A1* | 6/2011 | Veerasamy | ............ | B82Y 30/00 427/495 |
| 2011/0175060 A1* | 7/2011 | Okai | ...................... | B82Y 40/00 257/29 |
| 2012/0049160 A1* | 3/2012 | Sano | .................. | H01L 21/8213 257/27 |
| 2012/0112164 A1* | 5/2012 | Chu | .................. | H01L 21/02378 257/14 |
| 2013/0015375 A1* | 1/2013 | Avouris | ................... | G02B 6/10 250/504 R |
| 2014/0158989 A1* | 6/2014 | Byun | ................... | H01L 29/452 257/29 |
| 2014/0255044 A1* | 9/2014 | Avouris | ............... | G02B 6/1226 398/142 |
| 2015/0349185 A1* | 12/2015 | Hsu | ...................... | H01L 31/109 257/26 |
| 2016/0265047 A1* | 9/2016 | van Rooyen | ........ | G01N 27/414 |

OTHER PUBLICATIONS

Satou et al., "Characteristics of a terahertz photomixer based on a high-electron mobility transistor structure with optical input through the ungated regions", 2004, Journal of Applied Physics vol. 95, No. 4, pp. 2084-2089, published Feb. 15, 2004.*

Bala et al., "Investigation of graphene based miniaturized terahertz antenna for novel substrate materials", 2016, Engineering Science and Technology, an International Journal 19, pp. 531-537 (Available online Oct. 23, 2015).*

* cited by examiner

US 10,236,347 B2

METHOD OF PRODUCING AN ELECTRONIC DEVICE WITH A GRAPHENE DEVICE AND SEMICONDUCTOR DEVICE FORMED ON A COMMON SEMICONDUCTOR SUBSTRATE

BACKGROUND

Technical Field

Embodiments of the subject matter disclosed herein generally relate to electronic devices with a graphene device and semiconductor device formed on a common semiconductor substrate.

Discussion of the Background

Graphene is an extremely conductive material, which is desirable to use in many applications requiring high conductivity. Graphene devices, such as antennas, are typically manufactured separately from other devices with which they are integrated. Graphene devices are typically formed on a silicon carbide (SiC) substrate. Specifically, a graphene layer is grown on top of the silicon carbide substrate. The graphene device is then typically connected to other electronic devices formed on one or more additional substrates, which increases production costs and the amount of space occupied by the combined substrates.

Silicon carbide substrates are very expensive and only a portion of the substrate is used to actually form the graphene layer. Accordingly, one may consider forming a graphene layer on a smaller sized piece of silicon carbide, which is supported, for example, on a copper foil, and then transferring the graphene layer onto another substrate, such as a silicon substrate. Graphene is known to be very fragile and moving the graphene layer from the copper foil to a silicon substrate inevitably affects the structure of the graphene layer, and thus reduces the performance characteristics of the graphene layer.

Accordingly, there is a need to form graphene devices on a common substrate with a semiconductor device without requiring the use of a silicon carbide substrate.

SUMMARY

According to an embodiment, there is a method for producing an electronic device, which involves forming a graphene precursor on a first portion of a common semiconductor substrate, forming a graphene layer on the graphene precursor, and forming a semiconductor device on a second portion of the common semiconductor substrate.

According to another embodiment, there is an electronic device, which includes a common semiconductor substrate, a graphene device directly formed on a first portion of the common semiconductor substrate, and a semiconductor device directly formed on a second portion of the common semiconductor substrate.

According to yet another embodiment, there is a method for producing an electronic device, which involves selectively forming a graphene precursor on a first portion of a common semiconductor substrate, forming a graphene layer on the graphene precursor, and forming a semiconductor device on a second portion of the common semiconductor substrate, wherein the graphene layer forms an antenna and the graphene precursor is selectively formed into a pattern of the antenna.

BRIEF DESCRIPTION OF THE DRAWINGS

The accompanying drawings, which are incorporated in and constitute a part of the specification, illustrate one or more embodiments and, together with the description, explain these embodiments. In the drawings.

DETAILED DESCRIPTION

The following description of the embodiments refers to the accompanying drawings. The same reference numbers in different drawings identify the same or similar elements. The following detailed description does not limit the invention. Instead, the scope of the invention is defined by the appended claims. The following embodiments are discussed, for simplicity, with regard to the terminology and structure of electronic devices.

Reference throughout the specification to "one embodiment" or "an embodiment" means that a particular feature, structure or characteristic described in connection with an embodiment is included in at least one embodiment of the subject matter disclosed. Thus, the appearance of the phrases "in one embodiment" or "in an embodiment" in various places throughout the specification is not necessarily referring to the same embodiment. Further, the particular features, structures or characteristics may be combined in any suitable manner in one or more embodiments.

Figure 1:
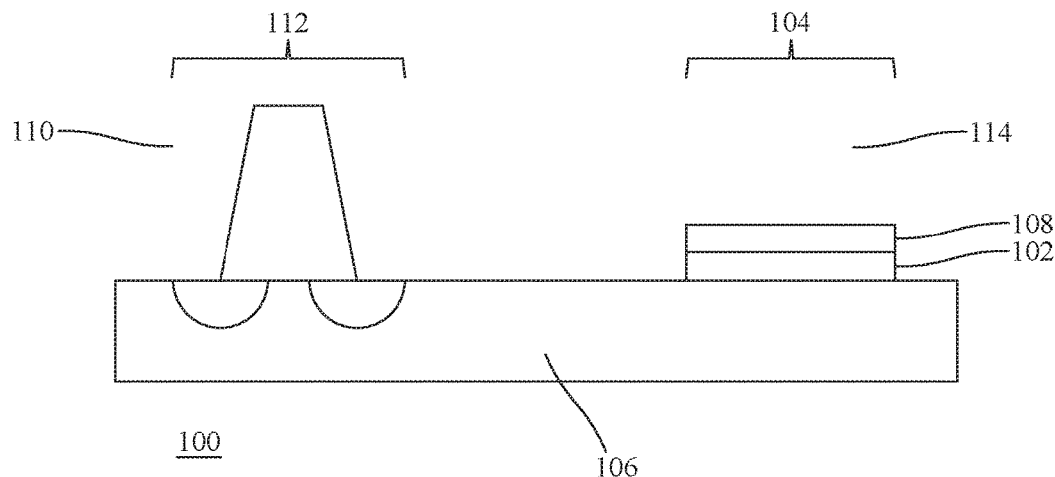
FIG. 1 is a cross-sectional view illustrating an electronic device with a graphene device and a semiconductor device formed on a common semiconductor substrate according to an embodiment.
Figure 2:
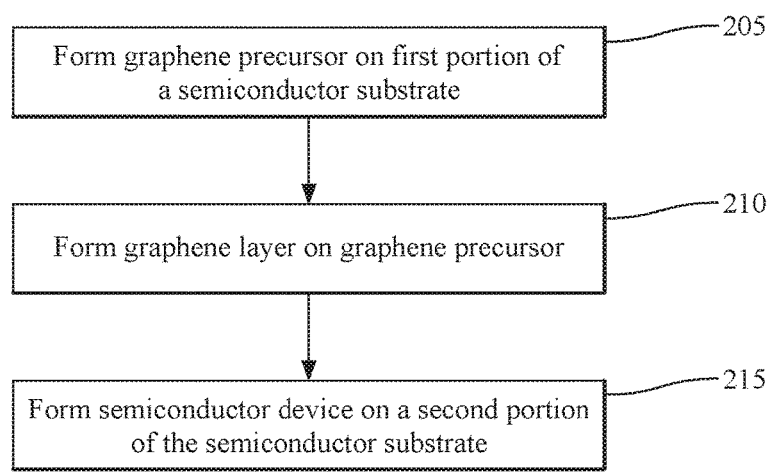
FIG. 2 is a flow chart illustrating a method for producing an electronic device with a graphene device and a semiconductor device formed on a common semiconductor substrate according to an embodiment.

Referring to FIGS. 1 and 2, according to an embodiment, a method of producing an electronic device 100 involves forming a graphene precursor 102 on a first portion 104 of a common semiconductor substrate 106 (step 205). A graphene layer 108 is then formed on the graphene precursor 102 (step 210). A semiconductor device 110 is then formed on a second portion 112 of the common semiconductor substrate 106 (step 215). Accordingly, the electronic device 100 includes a semiconductor device 110 and graphene device 114 formed on a common substrate 106.

The geometry of the graphene layer 108 depends on the type of graphene device being produced. Thus, for example, if an antenna is being produced, the graphene precursor 102 is selectively formed into the final antenna pattern so that when the graphene layer 108 is formed it has the desired antenna geometry.

Figure 3A:
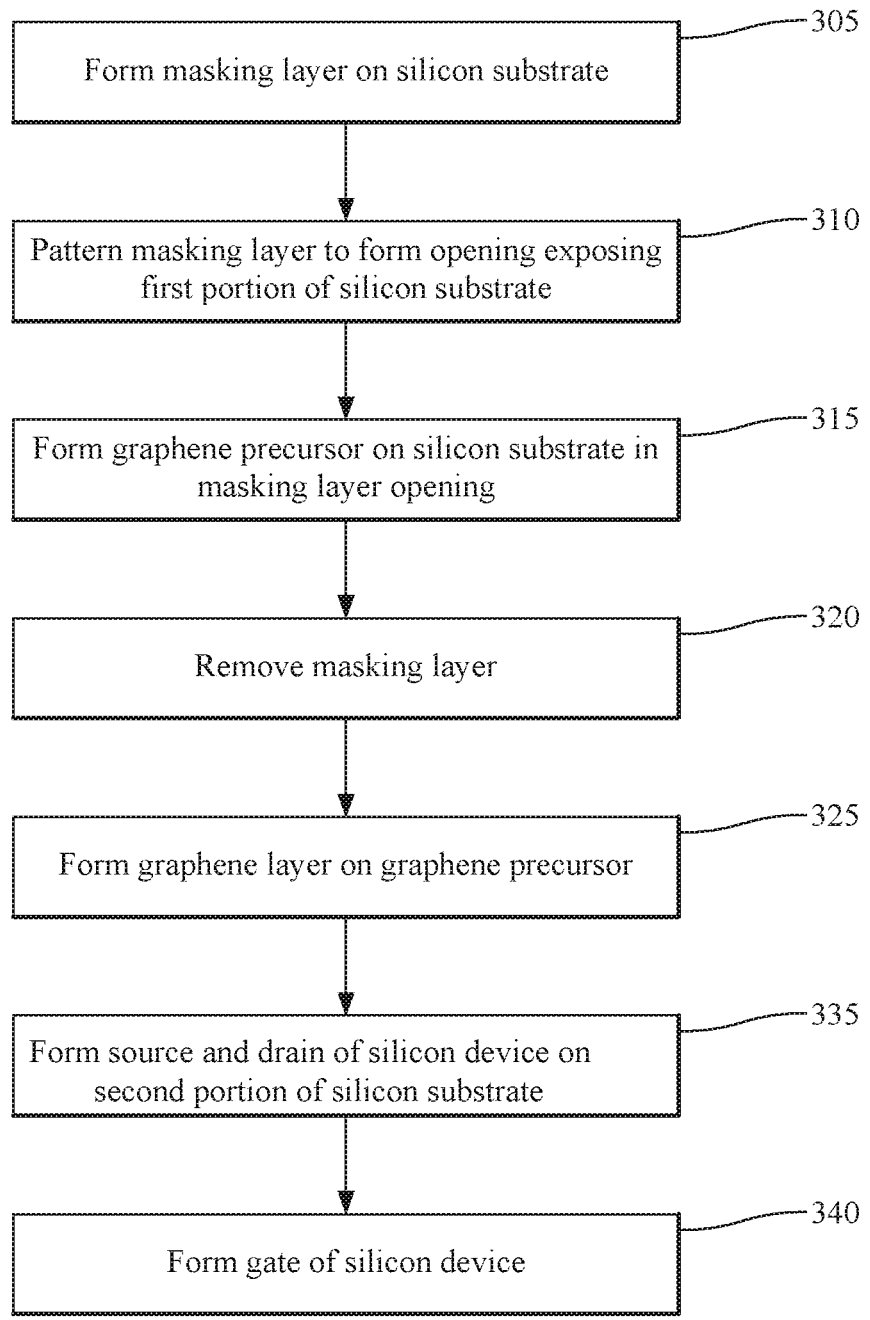
FIGS. 3A and 3B are flow charts illustrating methods for producing electronic devices with a graphene device and a semiconductor device formed on a common semiconductor substrate according to an embodiment.
Figure 3B:
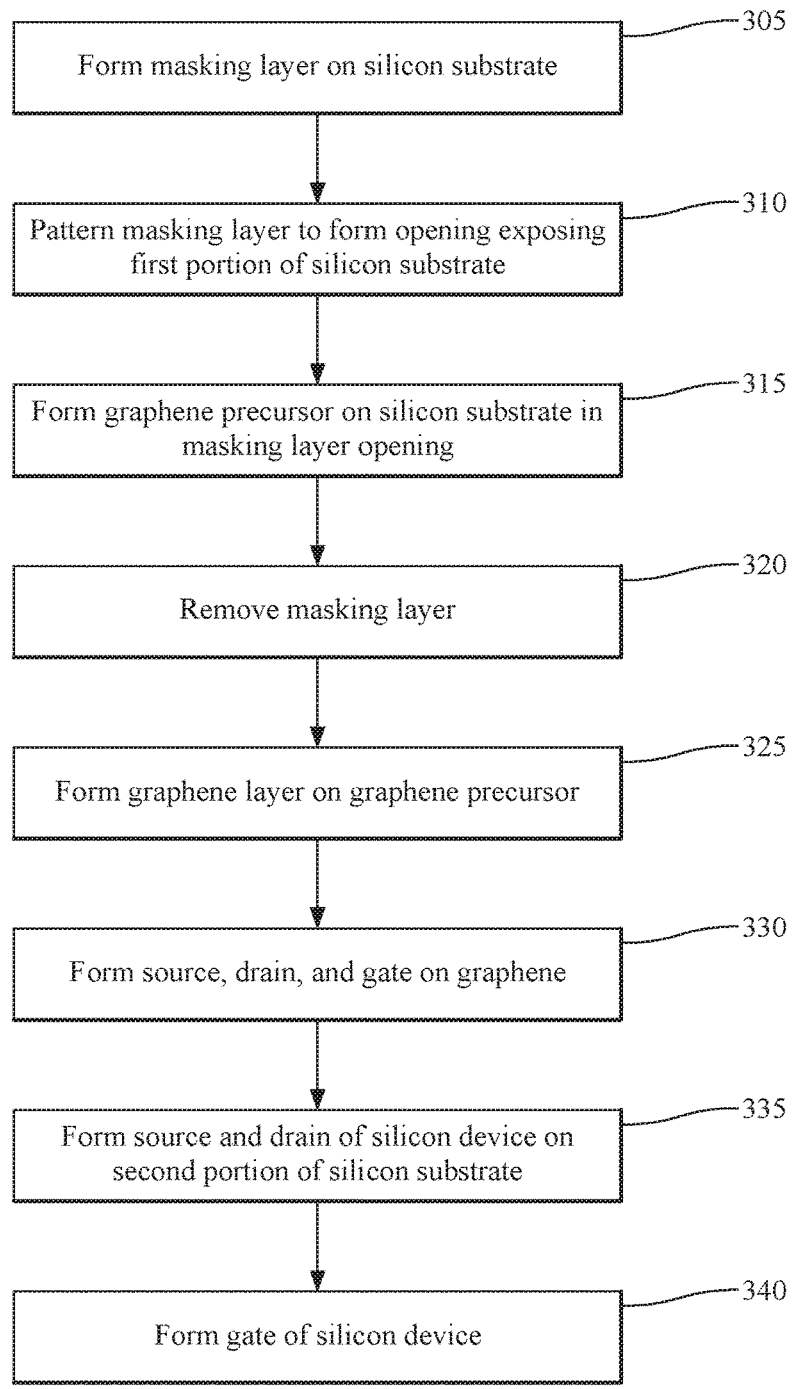

Additional details of the method for producing an electronic device with a graphene device and a semiconductor device formed on a common semiconductor substrate will now be presented in connection with the flow charts of FIGS. 3A and 3B and the cross-sectional views of FIGS. 4A-4J. FIGS. 3A and 3B are flow charts of a method for producing an electronic device with a graphene device and a semiconductor device; the graphene device produced by the method of FIG. 3A is an antenna and the graphene device produced by the method of FIG. 3B is a transistor.

Figure 4A:
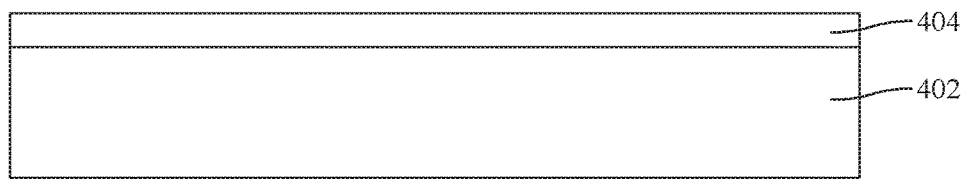
FIGS. 4A-4J are cross-sectional views illustrating methods for producing electronic devices with a graphene device and a semiconductor device formed on a common semiconductor substrate according to an embodiment.
Figure 4B:
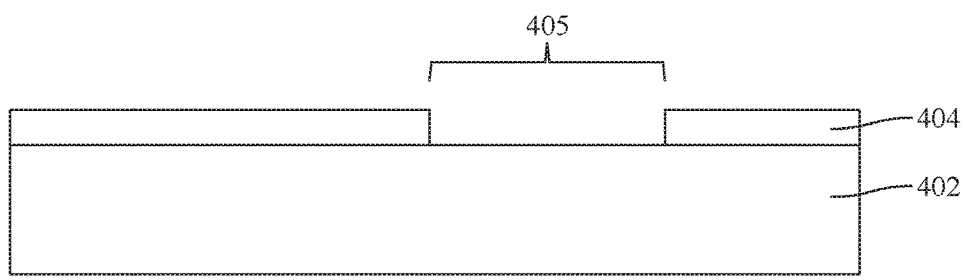

Turning first to the method of FIG. 3A and FIGS. 4A-4G, a masking layer 404 is formed on a common semiconductor substrate 402 (step 305 and FIG. 4A). In one embodiment, the common semiconductor substrate 402 is a silicon substrate. The masking layer 404 can be formed, for example, by growing silicon dioxide on the common semiconductor substrate 402 using thermal oxidation. The masking layer 404 is patterned to form an opening 405 exposing the common semiconductor substrate (step 410 and FIG. 4B). The patterning can be performed, for example, using lithography. The particular geometry of the opening 405 depends upon the desired graphene device, such as whether the graphene device is an antenna or a transistor.

Figure 4C:
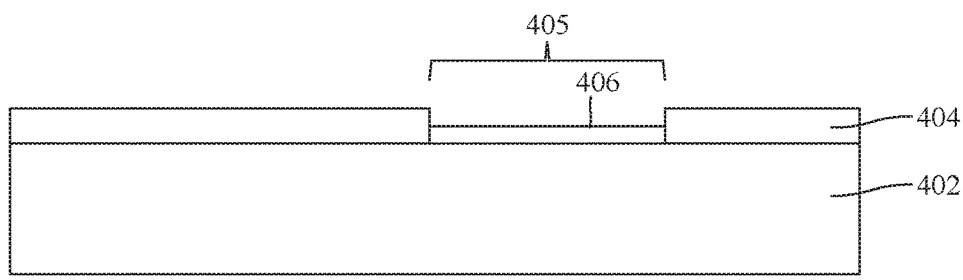

A graphene precursor 406 is then formed on the common semiconductor substrate 402 in the masking layer opening 405 (step 315 and FIG. 4C). The graphene precursor can be cubic silicon carbide (3C-SiC), also referred to as β-SiC. The graphene precursor can be formed, for example, by exposing the exposed surface of the common semiconductor substrate 402 to a flux of an acetylene beam or carbon beam at, for example, 900° C. Alternatively, the graphene precursor could be formed, for example, using an epitaxial process involving one of methane or propane with silane in a hydrogen atmosphere at a high temperature and low pressure.

Figure 4D:
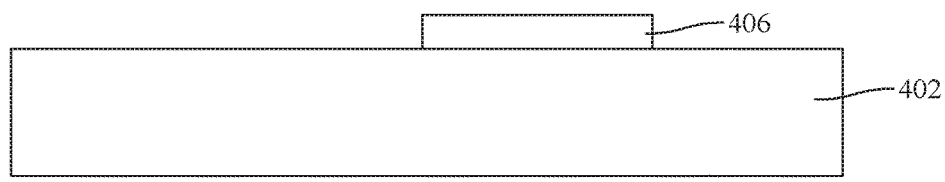
Figure 4E:
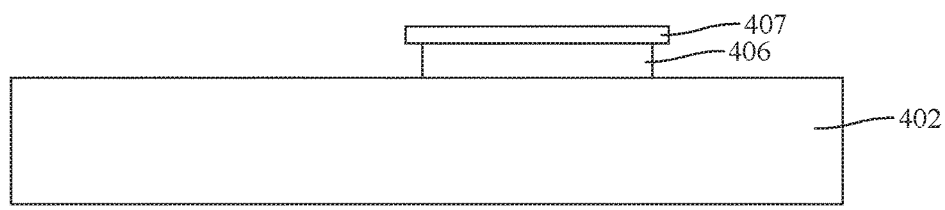
Figure 4F:
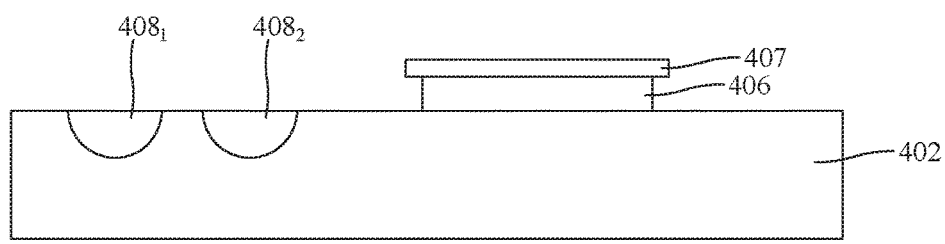
Figure 4G:
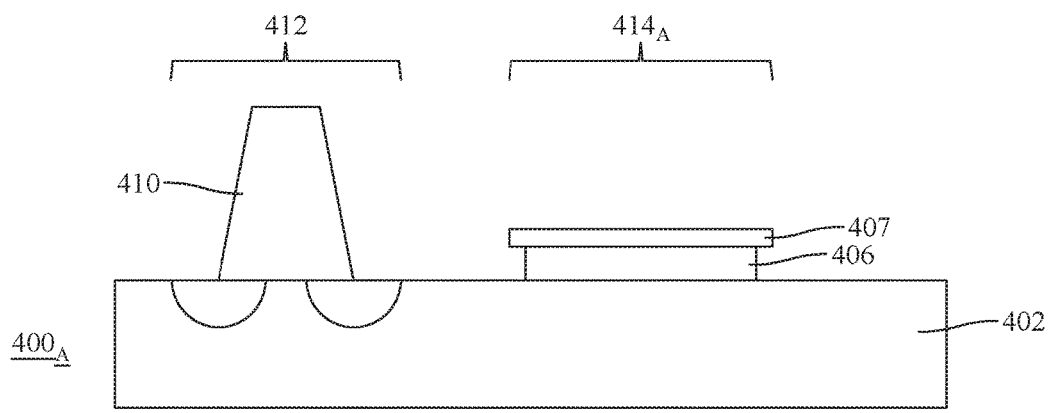
Figure 4H:
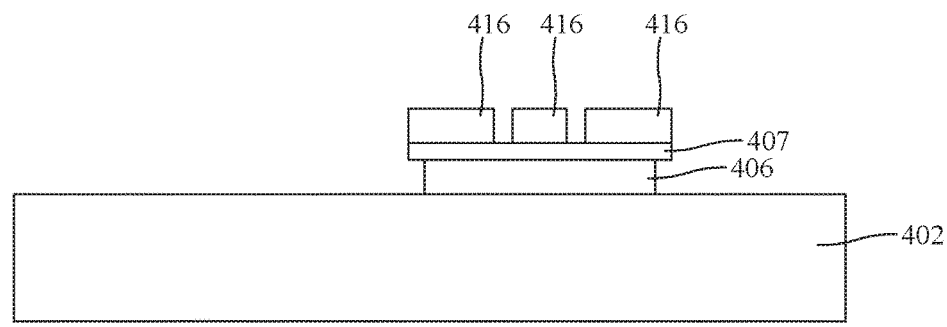
Figure 4I:
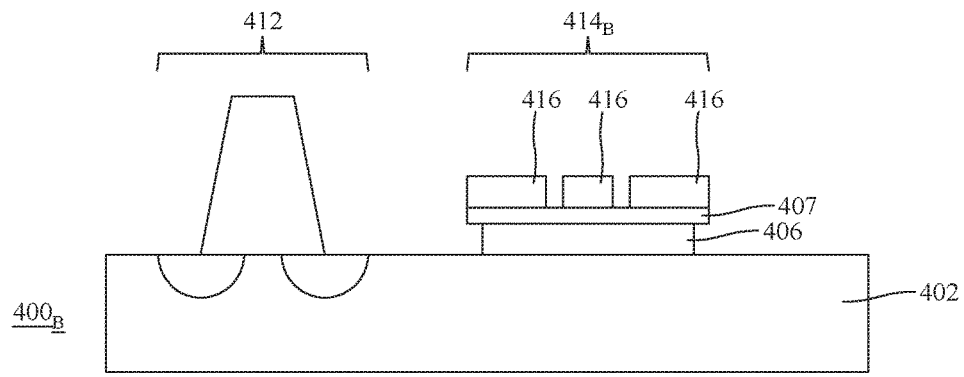

The masking layer is then removed, for example using a buffered oxide etch (step 320 and FIG. 4D). A graphene layer 407 is then formed on the graphene precursor 406, for example, by a high temperature anneal at 1300° C. under ultra-high vacuum conditions (step 325 and FIG. 4E). Accordingly, the graphene device forming an antenna in this embodiment has been formed and the semiconductor device can now be formed. Specifically, the source and drain 408_1 and 408_2 of the semiconductor device are formed on a second portion of the common semiconductor substrate 402, for example, by doping the common semiconductor substrate 402 (step 335 and FIG. 4F). Finally, the gate 410 is formed, which results in an electronic device $400_A$ having a semiconductor device 412 and a graphene device $414_A$ on a common semiconductor substrate 402 (step 340 and FIG. 4G).

The method of FIG. 3B can be performed to produce a graphene-based semiconductor device. The methods of FIGS. 3A and 3B involve similar steps 305-325, 335 and 340. The difference between these two methods is that in the method of FIG. 3B, after forming the graphene layer 407, the source, drain, and gate 416 of the graphene-based semiconductor device are formed (step 330 and FIG. 4H). The semiconductor device 412 is then formed in a similar manner to the description of the method of FIG. 3A, which results in the electronic device 400B illustrated in FIG. 4I, which includes a silicon-based semiconductor device 412 and a graphene-based semiconductor device $414_B$.

Figure 4J:
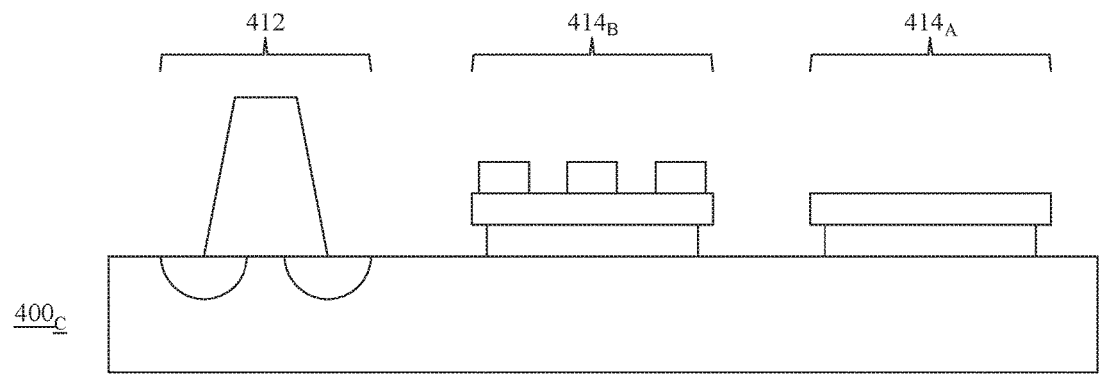

Although the description above involves forming a single silicon-based semiconductor device and a single graphene device on a common semiconductor substrate, more than one of each devices can be formed on the common semiconductor substrate. An example of this is illustrated in FIG. 4J, in which an electronic device $400_C$ includes a semiconductor device 412 and two graphene devices $414_A$ and $414_B$ formed on the common semiconductor substrate 402. Graphene device $414_A$ can be an antenna having geometry formed by a selective patterning of the masking layer exposing a first portion of the common semiconductor substrate. Graphene device $414_B$ can be a matching circuit coupled to the semiconductor device 412 and antenna $414_A$. Using a graphene-based matching circuit is particularly advantageous because it exhibits a very good frequency response, which can be particularly advantageous at high frequencies despite the high-power consumption of graphene-based transistors.

Because the one or more graphene devices are formed directly on the common semiconductor substrate, there are no additional substrates interposed between the graphene devices and the common semiconductor substrate. Further, the graphene devices are not subject to the performance degradation occurring when they are formed on a separate substrate and moved to the semiconductor substrate.

The manufacturing processes for semiconductor and graphene devices may be used to manufacture parts for consumer goods, such as mobile devices including mobile phones, tablet computers, laptop personal computers (PCs), and such as desktop personal computers (PCs), media playback devices, televisions, and the like. The disclosed manufacturing processes allow graphene to be obtained by a low-cost process for selective graphitization of portions of semiconductor substrates, and may provide a higher yield with higher predictability than graphitization by conventional mechanical exfoliation of graphene from graphite.

As discussed above, in some embodiments, graphene devices may be monolithically integrated with silicon CMOS logic to form high performance communications chips. Such chips may be used in communications devices, including satellites and hand-held mobile devices. In other embodiments, mixed graphene and semiconductor devices on a common substrate may be used to form logic circuits, such as NAND gates, NOR gates, and/or inverters.

The disclosed embodiments provide electronic devices with a graphene device and a semiconductor device formed on a common semiconductor substrate. It should be understood that this description is not intended to limit the invention. On the contrary, the exemplary embodiments are intended to cover alternatives, modifications and equivalents, which are included in the spirit and scope of the invention as defined by the appended claims. Further, in the detailed description of the exemplary embodiments, numerous specific details are set forth in order to provide a comprehensive understanding of the claimed invention. However, one skilled in the art would understand that various embodiments may be practiced without such specific details.

Although the features and elements of the present exemplary embodiments are described in the embodiments in particular combinations, each feature or element can be used alone without the other features and elements of the embodiments or in various combinations with or without other features and elements disclosed herein.

This written description uses examples of the subject matter disclosed to enable any person skilled in the art to practice the same, including making and using any devices or systems and performing any incorporated methods. The patentable scope of the subject matter is defined by the claims, and may include other examples that occur to those skilled in the art. Such other examples are intended to be within the scope of the claims.

What is claimed is:

1. A method for producing an electronic device, the method comprising:
   forming a graphene precursor on a first portion of a common semiconductor substrate;
   forming a graphene layer on the graphene precursor;

forming a semiconductor device on a second portion of the common semiconductor substrate;

forming the graphene precursor on a third portion of the common semiconductor substrate;

forming an additional graphene layer on the graphene precursor on the third portion of the common semiconductor substrate;

forming source and drain contacts on the additional graphene layer; and electrically coupling one of the source and drain contacts to the graphene layer on the first portion of the common semiconductor substrate, wherein the graphene layer is an antenna and the forming of the graphene layer comprises forming the graphene layer into an antenna pattern, and wherein prior to forming the graphene precursor on the first portion of the common semiconductor substrate, the method further comprises:

forming a masking layer on the common semiconductor substrate;

patterning the masking layer to form an opening in the first portion of the common semiconductor substrate.

2. The method of claim 1, wherein the forming of the masking layer comprises:

growing a silicon dioxide mask on the common semiconductor substrate using thermal oxidation.

3. The method of claim 1, wherein the forming of the graphene layer from the graphene precursor comprises growing graphene on the graphene precursor by annealing the graphene precursor.

4. The method of claim 1, wherein the forming of the semiconductor device comprises:

doping the common semiconductor substrate to form a source and drain; and forming a gate on the common semiconductor substrate.

5. The method of claim 1, further comprising:

forming antenna contacts on the graphene layer.

6. The method of claim 1, wherein the graphene precursor is silicon carbide (SiC).

7. The method of claim 6, wherein forming the silicon carbide (SiC) comprises:

exposing the first portion of the common semiconductor substrate to a flux of an acetylene or carbon beam.

8. The method of claim 6, wherein the silicon carbide (SiC) is formed in an epitaxial process involving one of methane and propane, and silane in a hydrogen atmosphere.

9. A method for producing an electronic device, the method comprising:

selectively forming a graphene precursor on a first portion of a common semiconductor substrate;

forming a graphene layer on the graphene precursor;

forming a semiconductor device on a second portion of the common semiconductor substrate;

forming the graphene precursor on a third portion of the common semiconductor substrate;

forming an additional graphene layer on the graphene precursor on the third portion of the common semiconductor substrate;

forming source and drain contacts on the additional graphene layer; and electrically coupling one of the source and drain contacts to the graphene layer on the first portion of the common semiconductor substrate, wherein the graphene layer forms an antenna and the graphene precursor is selectively formed into a pattern of the antenna.

10. A method for producing an electronic device, the method comprising:

forming a masking layer on the common semiconductor substrate;

patterning the masking layer to form an opening in the first portion of the common semiconductor substrate;

forming a graphene precursor on a first portion of a common semiconductor substrate;

forming a graphene layer on the graphene precursor;

forming a semiconductor device on a second portion of the common semiconductor substrate;

forming the graphene precursor on a third portion of the common semiconductor substrate;

forming an additional graphene layer on the graphene precursor on the third portion of the common semiconductor substrate;

forming source and drain contacts on the additional graphene layer; and electrically coupling one of the source and drain contacts to the graphene layer on the first portion of the common semiconductor substrate.

* * * * *